United States Patent [19]

Ohno et al.

[11] Patent Number: 4,981,714

[45] Date of Patent: Jan. 1, 1991

[54] METHOD OF PRODUCING FERROELECTRIC $LINB_{1-31\ x}TA_xO_3 0<X<1$) THIN FILM BY ACTIVATED EVAPORATION

[75] Inventors: Hirotaka Ohno; Hironori Matsunaga, both of Tenri; Yasunari Okamoto; Yoshiharu Nakajima, both of Nara, all of Japan

[73] Assignee: Sharp Kabushiki Kaisha, Osaka, Japan

[21] Appl. No.: 522,498

[22] Filed: Apr. 30, 1990

Related U.S. Application Data

[63] Continuation of Ser. No. 283,923, Dec. 13, 1988, abandoned.

[30] Foreign Application Priority Data

Dec. 14, 1987 [JP] Japan ................. 62-316476
Dec. 22, 1987 [JP] Japan ................. 62-326385

[51] Int. Cl.$^5$ .......................... B05D 3/06; B05D 5/12
[52] U.S. Cl. ........................................ 427/39; 427/38; 427/126.3; 427/166; 427/255.3; 427/126.2; 427/165
[58] Field of Search ............... 427/126.3, 255.3, 255.2, 427/255.1, 166, 38, 39, 126.2, 165

[56] References Cited

U.S. PATENT DOCUMENTS

| | | | |
|---|---|---|---|
| 4,361,114 | 11/1982 | Gurev | 118/723 |
| 4,362,765 | 12/1982 | Abe et al. | 427/38 |
| 4,813,768 | 3/1989 | Hamaguchi et al. | 350/347 R |

FOREIGN PATENT DOCUMENTS

| | | |
|---|---|---|
| 158479 | 3/1985 | European Pat. Off. . |
| 58-29280 | 6/1983 | Japan . |
| 59-5560 | 2/1984 | Japan . |
| 62-267942 | 11/1987 | Japan . |
| 2194555 A | 3/1988 | United Kingdom . |

Primary Examiner—Norman Morgenstern
Assistant Examiner—Roy V. King
Attorney, Agent, or Firm—Birch, Stewart, Kolasch & Birch

[57] ABSTRACT

A method of producing a ferroelectric thin film comprising the steps of evaporating metal Li or an oxide thereof as a Li source, metal Nb or an oxide thereof as a Nb source and metal Ta or an oxide thereof as a Ta source in a substantially oxygen gas plasma atmosphere while controlling the respective heating temperatures independently from each other and simultaneously depositing the Li, Nb and Ta on a substrate so as to obtain an $LiNb_{1-x}Ta_xO_3$ ($0<x<1$) thin film which shows ferroelectricity.

7 Claims, 2 Drawing Sheets

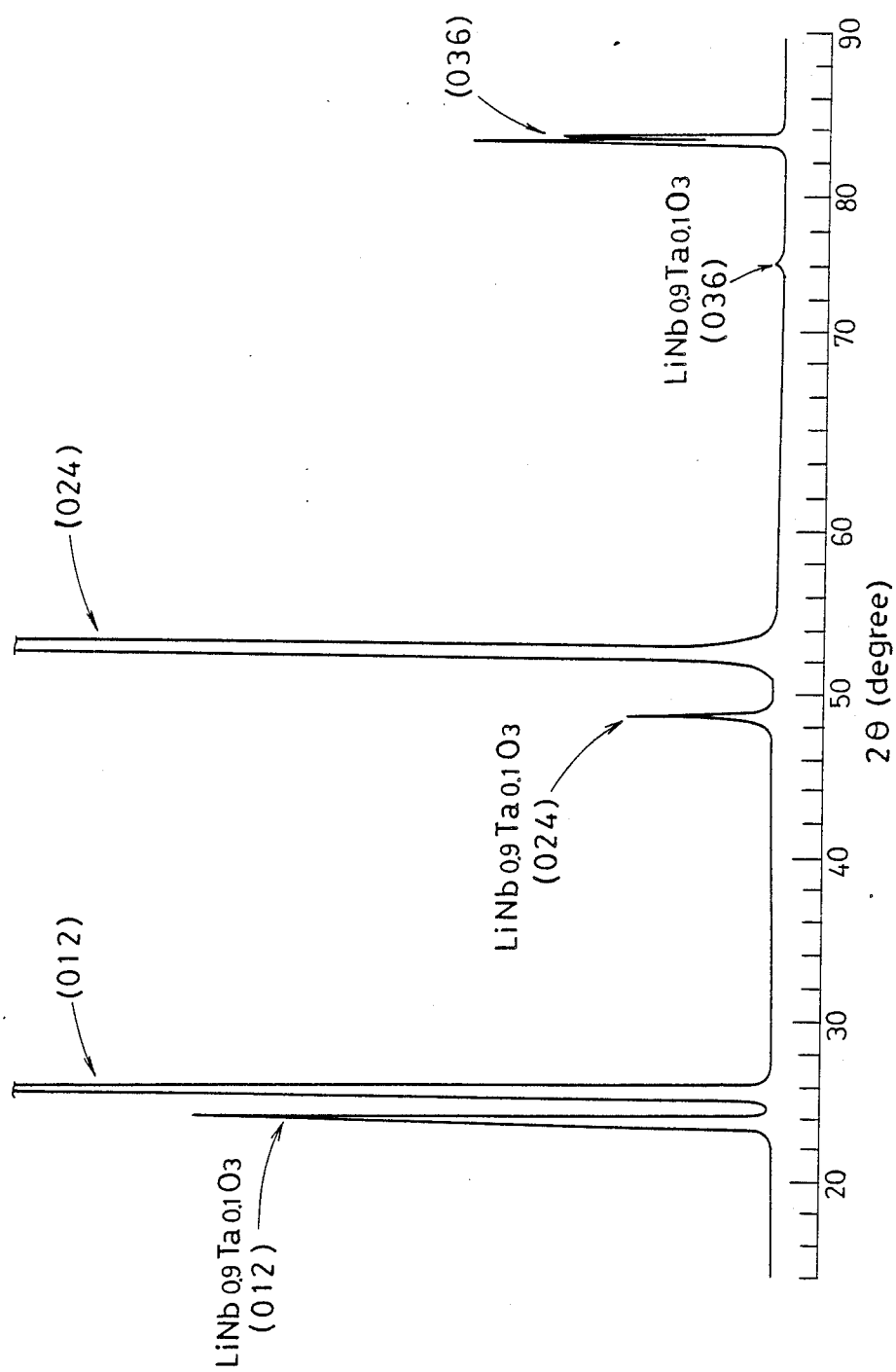

METHOD OF PRODUCING FERROELECTRIC LINB$_{1-31 x}$TA$_x$O$_3$0<X<1) THIN FILM BY ACTIVATED EVAPORATION

This application is a continuation of application Ser. No. 07/283,923 filed Dec. 13, 1988, now abandoned.

BACKGROUND OF THE INVENTION

1. Field of the Invention

The present invention relates to a method of producing a ferroelectric thin film and, more particularly, to a method of producing a high-purity LiNb$_{1-x}$Ta$_x$O$_3$ ($0 \leq x \leq 1$) thin film.

2. Description of the Prior Art

It is well known that LiNb$_{1-x}$Ta$_x$O$_3$ ($0 \leq x \leq 1$) is a ferroelectric material having a high melting point and a high Curie temperature and that it has a large electromechanical coupling coefficient as compared with other ferroelectric materials. Because of these properties, the bulk single crystal of LiNb$_{1-x}$Ta$_x$O$_3$ ($0 \leq x \leq 1$) has been put to practical use as a material for surface acoustic wave (SAW) devices. By utilizing the electrooptical effect and nonlinear optical effect of LiNb$_{1-x}$Ta$_x$O$_3$ ($0 \leq x \leq 1$), wide application of LiNb$_{1-x}$Ta$_x$O$_3$ ($0 \leq x \leq 1$) has been developed for use in optical devices, for example, as a substrate material for optically. integrated circuit material including an optical waveguide, optical modulator, optical coupler and wavelength transducer. Attempts, have also been made for the application of LiNb$_{1-x}$Ta$_x$O$_3$ ($0 \leq x \leq 1$) in various optical IC sensors which utilize the change in the refractive index caused by a change in the environmental or external factors such as stress and temperature. In addition, LiNb$_{1-x}$Ta$_x$O$_3$ ($0 \leq x \leq 1$) exhibits a special optical effect when impurities such as Fe are added thereto, the impurities greatly change the refractive index of the compound under conditions of light irradiation. The application of LiNb$_{1-x}$Ta$_x$O$_3$ ($0 \leq x \leq 1$) to an optical memory or a three dimensional hologram by utilizing the above-described phenomenon has also been investigated.

At the first stage, a wafer for developing devices for the above-described applications of LiNb$_{1-x}$Ta$_x$O$_3$ ($0 \leq x \leq 1$) is cut from a bulk single crystal which has been produced by a pulling method and which has an appropriate crystalline orientation and a thickness of several hundred $\mu$m.

In the case where a wafer is cut from a bulk single crystal which has been obtained by a pulling method, it is only a region of several tens of $\mu$m thick from the surface which is important for the actual functioning of the device. Therefore, if it is possible to produce a device of LiNb$_{1-x}$Ta$_x$O$_3$ ($0 \leq x \leq 1$) in the form of a thin-film device, great benefit in terms of effectiveness can be expected from the points of view of properties, materials, cost and productivity. In the present state of the art, however, no technique of producing such a thin film has been adequately established.

As a thin-film forming method of LiNb$_{1-x}$Ta$_x$O$_3$ ($0 \leq x \leq 1$), sputtering, liquid phase epitaxy and CVD have conventionally been reported. Among these, sputtering is used most widely. It has been reported that according to this method, a thin-film twin crystal is hetero-epitaxially grown on a single crystal substrate of sapphire (Z face and R face), rock crystal (Z face), magnesium oxide (<111>face), etc. (Japanese Patent Publication Nos. 29280/1983 and 5560/1984).

This is a method of sputtering a target of a powder or a sintered powder having the same composition as the intended material so as to form an oxide thin film on a substrate. A method of sputtering a metal or alloy target in an oxygen gas atmosphere is also used. Since inert gas such as Ar gas is used as a sputtering gas in both of the above-described methods, there is a strong possibility of Ar, or the like, mixing with the thin film as impurities, so that it is difficult to produce a thin film having the desired properties at a comparatively low temperature.

In the case of forming a thin-film single crystal by hetero-epitaxial growth on a substrate which has a large lattice mismatching, it is important that the crystal lattice has a lattice constant approximating that of the substrate. For this purpose, it is necessary to change the composition of the thin film which is being formed. In order to mitigate the lattice mismatching, it is necessary to continuously change the composition of the film or laminating films which have different compositions in multi-layers, and in order to obtain the optimal conditions to diligently control the materials depending on the results by trial and error in many experiments.

Another method is to simultaneously deposit oxide materials from an evaporating source which correspond to the respective components of a thin film by electron beam evaporation or resistance heating. Since the evaporation rate is controlled by varying the heating temperatures for the respective components, it is comparatively easy to control the composition of the film. By this method, however, since an oxide is used as a material, the oxygen component of the materials is lacking because of the difference in the vapor pressure at the atomic level between a metal element and an oxygen element, thereby making it difficult to form a thin film having a uniform composition. As a countermeasure, a method of simultaneously evaporating by heating a plurality of single element components in an oxygen gas atmosphere in place of oxide materials has been proposed. In the case of LiNb$_{1-x}$Ta$_x$O$_3$ ($0 \leq x \leq 1$), however, since it is impossible to efficiently introduce oxygen into the film, the film formation in an oxygen atmosphere is difficult.

SUMMARY OF THE INVENTION

Accordingly, it is the objective of the present invention to eliminate the above-described problems in the prior art and to provide a method of producing an LiNb$_{1-x}$Ta$_x$O$_3$ ($0 \leq x \leq 1$) single-crystal thin film having few impurities and therefore facilitating better control of the composition of the film and formation of a multilayer films.

The present invention provides a method of producing a thin film having a given composition (value x) with good film-forming controllability and as few impurities mixed as possible without having to change the material. As a result, a method of producing a LiNb$_{0.9}$Ta$_{0.1}$O$_3$ ($0 \leq x \leq 1$) single-crystal thin film having a high purity and good crystallizability, which is difficult to obtain by a conventional method, has been found. The present invention has been achieved on the basis of this finding.

According to the present invention, a ferroelectric thin film of LiNb$_{1-x}$Ta$_x$O$_3$ ($0 \leq x \leq 1$) is producedby evaporating metal Li or an oxide thereof as an Li source, metal Nb or an oxide thereof as an Nb source and metal Ta or an oxide thereof as a Ta source, in a substantially oxygen gas plasma atmosphere, while controlling the respective heating temperatures independently from each other and simultaneously depositing them on a substrate.

In other words, the present invention provides a method of depositing metal niobium (Nb), tantalum (Ta) and lithium (Li) on a substrate separately from each other and simultaneously in an oxygen plasma atmosphere.

According to the present invention, since it is possible to control the temperatures of the evaporation cells for metal niobium, tantalum and lithium respectively, as desired, Nb, Ta and Li are evaporated at the respective evaporation rates in accordance with the desired thin film composition. As a result, a film having a given composition and a given lattice constant is readily obtained. In addition, since it is possible to continuously change the composition, the mismatching of the lattice constant with the substrate is mitigated and the warping of the laminated $LiNb_{1-x}Ta_xO_3(0 \leq x \leq 1)$ single-crystal thin film due to the stress between the substrate and the thin film is reduced.

A single-crystal thin film is more advantageous than a bulk single crystal, because the manufacturing cost of a bulk single crystal is higher. The manufacturing cost of a single crystal thin film is lower because the heteroepitaxial growth of a single crystal occurs on a substrate of a different substance from the single crystal, and thus enables a reduction in cost.

The $LiNb_{1-x}Ta_xO_3(0 \leq x \leq 1)$ thin film obtained by the present invention is a high-purity single-crystal thin film having excellent capacity, so that its application can be enlarged.

The above and other objects, features and advantages of the present invention will become clear from the following description of the preferred embodiment thereof, taken in conjunction with the accompanying drawings.

BRIEF DESCRIPTION OF THE DRAWINGS

FIG. 2 is a characteristic curve of the results of the X-ray diffraction of a thin film obtained by the embodiment.

DESCRIPTION OF THE PREFERRED EMBODIMENT

Figure 1:
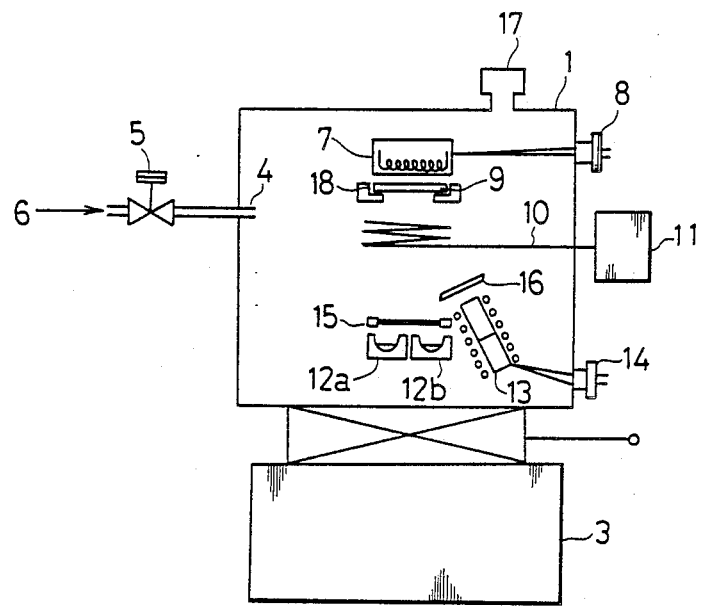
FIG. 1 schematically shows the structure of an apparatus for producing an $LiNb_{1-x}Ta_xO_3(0 \leq x \leq 1)$ single-crystal thin film by an embodiment of a method according to the present invention.

According to the present invention, a high-purity $LiNb_{1-x}Ta_xO_3(0 \leq x \leq 1)$ thin film is formed on a predetermined substrate by simultaneous multi-component evaporation utilizing plasma anodization by Rf excitation (100 to 250W). The $LiNb_{1-x}Ta_xO_3(0 \leq x \leq 1)$ thin film is formed by ordinary simultaneous multi-component evaporation in a substantially oxygen gas plasma atmosphere. "Substantially oxygen gas plasma atmosphere" means the state whereupon oxygen gas is positively introduced into a vacuum chamber and the correct setting for an evaporation atmosphere is obtained and almost nothing exists in the vacuum atmosphere except oxygen gas and the components of a thin film.

Preferred evaporating materials (evaporating sources) in the present invention include base metal elements such as Li (lithium), Nb (niobium) and Ia (tantalum) and oxides thereof. A combination of the above elements is also acceptable.

In simultaneous multi-component evaporation in the present invention, an electron beam heating device or a Knudsen cell is preferable as a device for heating evaporating sources, but any other device that can heat the evaporating sources to predetermined temperatures may also be used.

Of particular note, high-melting metals such as tantalum and niobium are preferably melted by electron beams under a vacuum of less than about $10^{-4}$ Torr by independent electron beam heating devices. More specifically, it is preferable that Ta and Nb are disposed in water-cooled copper crucibles or vertically erected as metal rods on a holder and that the electron beams are focused on the respective parts thereof so as to melt and evaporate and simultaneously deposit them on a substrate disposed in a vacuum container. At this time, it is important that the amount of irradiation of electron beam (material heating temperature) and the positions on which the electron beams impinge be appropriately controlled. Metal lithium is also heated and evaporated separately from Ta and Nb by a Knudsen cell at a predetermined temperature which is set by the above-described program and deposited on the substrate simultaneously with Ta and Nb. In this way, the components Li, Ta and Nb are simultaneously evaporated in an oxygen plasma atmosphere. Thus, it is easy to control the composition (value x) os the film, namely, to control the amount of evaporation of each material by varying the material heating temperature. For example, in order to form an $LiNb_{0.9}Ta_{0.1}O_3$ thin film, (1) Nb, Ta and Li metals having purities of not less than 99.9%, respectively, are preferably used. Especially, the high-melting metals Nb and Ta should be 99.9 to 99.999% in purity.

(2) The emission current of the heating electron beam which is projected at Nb and Ta is preferably 100 to 200 mA, or preferably 150 mA for Nb, and preferably 30 to 100 mA, or preferably 50 mA for Ta. The heating temperature of the Knudsen cell for Li metal is preferably set at 500 to 600° C., or preferably at 550° C.

At this time, the degree of vacuum of the vacuum chamber should be set at $1 \times 10^{-8}$ to $1 \times 10^{-7}$ Torr, or preferably $1 \times 10^{-8}$ Torr. After evacuation, oxygen gas is introduced into the vacuum chamber until the degree of vacuum of the vacuum chamber becomes $1 \times 10^{-4}$ to $5 \times 10^{-4}$ Torr, or preferably $2 \times 10^{-4}$ Torr.

For the substrate in the present invention, a substrate which is heated during evaporation, for example, a sapphire substrate is suitable with respect to adhesiveness and the like.

An embodiment of the present invention will now be explained. It is to be understood that the present invention is not restricted to this particular embodiment.

FIG. 1 schematically shows the structure of an apparatus for producing an $LiNb_{1-x}Ta_xO_3(0 \leq x \leq 1)$ single-crystal this film by an embodiment of a method according to the present invention.

This apparatus is composed of a vacuum container 1 provided therein with two electron beam evaporating sources 12a and 12b for evaporating Ta and Nb, respectively, and having shutter 15 for controlling the deposition of each material, a Knudsen cell (K-CELL) 13 for evaporating Li and having shutter 16 for controlling the deposition of the material, a high-frequency induction (Rf) coil 10 for converting oxygen gas into oxygen plasma, and a matching box 11, etc. In the upper portion of the vacuum container 1, a substrate holder 18 for receiving a substrate 9 and a heater 7 for heating the substrate holder 18 and the substrate 9 to a high temperature are provided. Each of numerals of 8 and 14 denotes a thermocouple.

A method of producing $LiNb_{1-x}Ta_xO_3 (0 \leq x \leq 1)$ will be described in the following.

The vacuum container 1 was evacuated to the order of $10^{-8}$ Torr by a vacuum evacuating device 3, and a variable leak valve 5 is opened to introduce oxygen gas 6 from an oxygen introducing pipe 4 until the degree of vacuum becomes $2 \times 10^{-4}$ Torr. A high-frequency current is applied to the matching box 11 to generate oxygen plasma in the Rf coil 10. The Rf power applied is 180 W. Thereafter, the electron beam evaporating sources 12a, 12b and the K-CELL 13 were heated and evaporated separately from each other and simultaneously deposited on the sapphire substrate 9 mounted on the substrate holder 18 which had been heated to 700° C. by the heater 7.

The evaporation conditions were such that the emission currents of the electron beam evaporating sources 12a and 12b were 150 mA for Nb and 50 mA for Ta and the heating temperature of the K-CELL 13 was 550° C. The evaporation time was 2.5 hours. A transparent thin film had grown to a thickness of 7500 Å on the sapphire substrate (R face) 9.

Through composition analysis of the thin film obtained by a secondary ion mass analyzer (SIMS) and an Auger electron spectroscope (AES), it was observed that the entire film was uniformly composed of $LiNb_{0.9}Ta_{0.1}O_3$.

When the X-ray diffraction pattern of the film was measured, the results shown in FIG. 2 were obtained. On the sapphire substrate 9, the reflections (012), (024) and (036) of $LiNb_{0.9}Ta_{0.1}O_3$ were obtained corresponding to the R-face reflections (012), (024) and (036). The value of the lattice plane interval obtained from the diffraction pattern agreed with literature value of 1.876 Å ((024) reflection). Furthermore, it was found from the X-ray precession photograph that the X-ray reflection from the thin film was spotted, and the diffraction pattern thereof was similar to that of the sapphire substrate.

From the above results, it was confirmed that the film obtained was an $LiNb_{0.9}Ta_{0.1}O_3$ single-crystal thin film and that the R face of this film had grown hetero-epitaxially on the sapphire substrate (R face).

In this way, according to this embodiment, it is possible to efficiently introduce oxygen to a film and reduce the epitaxy temperature and, hence, to vary the composition of the film as desired not by changing the material but by varying the heating temperature of each material so as to control the evaporation rate.

In addition, it is possible to laminate thin films having different compositions by using a shutter during deposition, and facilitate the control of the film thickness.

As described above, according to the present invention, it is possible to form a thin film uniformly on a single-crystal substrate through hetero-epitaxial growth by oxidizing the metal vapors of Li, Nb and Ta in an oxygen plasma atmosphere at a substrate temperature as low as 700° C. as compared with the melting point of a bulk single-crystal, which is as high as 1253 to 1650° C.

The $LiNb_{1-x}Ta_xO_3 (0 \leq x \leq 1)$ thin film produced according to the present invention has a very high purity and a good crystallizability.

It is also possible to continuously change the composition of a film, and no warping is observed caused by mismatching of the lattice constant between the substrate and the film.

It is possible to form thin films having different compositions with good film thickness controllability and it is easy to laminate thin films having different compositions (value x) in multi-layers if the deposition of each material is controlled by a shutter. When a thin film is used for an optical waveguide, optical modulator, optical coupler, wavelength transducer, etc., an optical device free from photodeterioration is realized.

Thus, according to the present invention, it is possible to provide an $LiNb_{1-x}Ta_xO_3 (0 \leq x \leq 1)$ thin film which is adaptable to various devices in large quantities at a low cost.

While there has been described what is at present considered to be a preferred embodiment of the invention, it will be understood that various modifications may be made thereto, and it is intended that the appended claims cover all such modifications that fall within the true spirit and scope of this invention.

What is claimed is:

1. A method of producing a ferroelectric thin film comprising the steps of evaporating metal Li or an oxide thereof as a Li source, metal Nb or an oxide thereof as a Nb source and metal Ta or an oxide thereof as a Ta source in a substantially oxygen gas plasma atmosphere while controlling the respective heating temperatures of the evaporation independently from each other and simultaneously depositing at controlled evaporation rates said Li, Nb and Ta on a substrate so as to obtain a $LiNb_{1-x}Ta_xO_3 (0<x<1)$ thin film which shows ferroelectricity.

2. A method of producing a ferroelectric thin film according to claim 1, wherein said Li source is metal Li having a purity of not less than 99.9%, said Nb source is a high-melting metal Nb having a purity of not less than 99.9 to 99.999%, and said Ta source is a high-melting metal Ta having a purity of not less than 99.9 to 99.999%.

3. A method of producing a ferroelectric thin film according to claim 1, wherein said Li source is $Li_2O$, said Nb source is $Nb_2O_5$ and said Ta source is $Ta_2O_5$.

4. A method of producing a ferroelectric thin film according to claim 2, wherein said high-melting metals Nb and Ta are evaporated by electron beam evaporation and said metal Li is evaporated by a Knudsen cell.

5. A method of producing a ferroelectric thin film according to claim 2, wherein said substrate is a sapphire substrate.

6. A method of producing a ferroelectric thin film according to claim 4, wherein the emission current of the heating electron beam is set at 100 to 200 mA for said metal Nb and at 30 to 100 mA for said metal Ta, and the heating temperature of said Knudsen cell is set at 500 to 600° C.

7. A method of producing a ferroelectric thin film according to claim 1, wherein said oxygen gas plasma atmosphere is formed by introducing oxygen gas into a vacuum of $1 \times 10^{-7}$ to $1 \times 10^{-8}$ Torr until the degree of vacuum becomes $1 \times 10^{-4}$ to $5 \times 10^{-4}$ Torr.

* * * * *